United States Patent

[11] 3,623,071

[72] Inventor John M. Bentlye
Crofton, Md.
[21] Appl. No. 66,511
[22] Filed Aug. 24, 1970
[45] Patented Nov. 23, 1971
[73] Assignee The United States of America as represented by the Secretary of the Navy

[54] FORCED THRESHOLD ULTRA-HIGH-SPEED ANALOG TO DIGITAL CONVERTER
6 Claims, 3 Drawing Figs.

[52] U.S. Cl. ........ 340/347 AD, 235/154
[51] Int. Cl. ........ H03k 13/02
[50] Field of Search ........ 340/347, 347 AD, 347 DA, 347 DD; 235/154, 155

[56] References Cited

UNITED STATES PATENTS

| | | | |
|---|---|---|---|
| 3,072,332 | 1/1963 | Margopoulos | 235/154 |
| 3,221,324 | 11/1965 | Margopoulos | 340/347 |
| 3,493,964 | 2/1970 | Hunger | 340/347 |
| 3,501,625 | 3/1970 | Gorbatenko | 235/154 |

*Primary Examiner*—Thomas A. Robinson
*Attorneys*—R. S. Sciascia and Thomas O. Watson, Jr.

ABSTRACT: An analog to digital converter that provides conversion in real time at high bit rates and accuracy without the use of a digital to analog converter and successive comparisons or subtractions of reference voltages.

PATENTED NOV 23 1971 3,623,071

INVENTOR.
JOHN M. BENTLEY
BY Thomas O. Watson Jr.
ATTORNEY

FORCED THRESHOLD ULTRA-HIGH-SPEED ANALOG TO DIGITAL CONVERTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Many prior art radar systems are employing digital processing techniques to resolve doppler frequency, cancel clutter, and to resolve map cells. High-speed analog to digital converters are necessary to convert the radar video to digital numbers. Present A/D systems make use of digital to analog converters in some form, to effect an analog to digital conversion, this technique involving decision and switching hardware. Also these A/D converters determine, within their limits of accuracy, the level of the unknown analog signal by successive comparison of the unknown signal to known references, or by successive subtractions from the unknown of known reference signals, or some similar technique. This involves additional hardware and delays.

The general classes of A/D converters are known in the prior art. A first class of converters operates on a sampling principle. A sample of the analog voltage to be converted is taken at a discrete time and is held while the converter drives a digital register through a sequence of steps. At the end of the sequence of steps the number contained in the digital register is indicative or representative of the sample's analog voltage level. The digital output signal is available only at the end of this sequence of steps. After the first sample has been completely quantized or digitized a second sample is taken and the process is repeated.

In some applications the A/D converter in the system must provide a more or less continuous digital output signal so that the digital signal may be used at any time and not just at the end of a conversion interval. A second class of A/D converters, known as continuous or tracking A/D converters, operates on a servo-type principle. The essence of this type of converter is an up/down or reversing counter which is continuously servoed to provide a more continuous digital output signal. In this type of A/D converter the digital output signal is usually converted into an analog signal indicative or representative of the digital signal. This analog signal is compared to the analog input signal in a comparison section of the converter. The comparison section provides output signals which cause the counter to count up or down. The direction of counting is controlled such that the analog signal indicative of the digital signal becomes more nearly equal to the analog input signal. While this type of converter may be referred to as a continuous converter, it is not truly continuous because the digital signal is stepped from one quantization level to another. However for most practical purposes a tracking A/D converter may be considered continuous.

One disadvantage of the prior art tracking, or continuous, A/D converter is that their response to rapidly varying input signals is often too slow. That is, the counter generally counts clock pulses to count up or down so that the counter is changed by one count each clock pulse, and thus, if the input signal varies too rapidly the counter will lag behind. This problem can be partly alleviated by increasing the clock frequency. However there is a practical limit to the clock frequency and high-speed components greatly increase the cost.

The present invention eliminates the use of a D/A converter and successive comparisons or subtractions of reference voltages. The problem in general, is to convert a wide band analog signal, of specified amplitude, into a digital representation of that signal, at rates exceeding $10^6$ conversions per second and exhibiting an accuracy in the order of 0.1 percent of full scale. Such equipment usually has size and weight limitations which demand minimizing the number of functions and the associated hardware.

Thus the intent of the present invention is to reduce the number of decisions necessary, while still obtaining the required performance. Systems requiring only one decision have been devised; however, the technique requires a prohibitive amount of hardware. These systems are referred to as parallel systems. The system being disclosed herein utilizes a one-decision scheme; however, it is not of the full parallel type. A parallel unit would require a separate comparator circuit for each quanta (1,024 for a 10-bit unit). The present invention can be implemented using a considerably smaller number of reference levels. As an example, a 10-bit converter could be made up of 32 primary levels with each level 32 quanta greater than the previous one. One subprimary level would also be used which would cover 32 quanta. The A/D conversion system disclosed herein is as shown and disclosed later. The significant concept associated with this invention is a technique used to determine the level of an analog signal in the primary comparators. This concept makes use of a forced threshold transition which can be random if so desired. The forced threshold transition is effected by adding a fast-rising pulse to the unknown analog, this pulse being at least 32 quanta in amplitude. This transition indicates the threshold below which the unknown signal lies at that particular instant of time. The subprimary stage determines how far below this threshold the unknown signal lies.

SUMMARY OF THE INVENTION

Therefore, the present invention offers many improvements over the disadvantages and shortcomings of prior art analog digital converters. Thus, the invention provides an analog to digital converter which provides conversion, in real time, at high bit rates and accuracy, but accomplishes this without the use of a digital to analog converter first followed by successive comparisons or subtractions to a reference voltage. The system being disclosed herein utilizes a one-decision scheme; however, it is not of the full parallel type.

OBJECTS OF THE INVENTION

An object of the present invention is the provision of an ultra-high-speed analog to digital converter.

Another object of the present invention is the provision of an analog to digital converter which does not use a digital to analog conversion first followed by successive comparison to reference voltages.

Still another object of the present invention is the provision of a system which utilizes a one-decision scheme.

Yet another object of the present invention is the provision of an analog to digital converter wherein a forced threshold transition is utilized at any time to determine the threshold below which an unknown signal lies.

Other objects and many of the attendant advantages of this invention will be readily appreciated as the same becomes better understood by reference to the following detailed description when considered in connection with the accompanying drawings in which like reference numerals designate like parts throughout the figures thereof.

BRIEF DESCRIPTION OF THE DRAWINGS

Referring now to the drawings wherein FIG. 1 shows a block diagram of a version of the forced threshold analog to digital converter, there is an input terminal 10 which is used to receive an unknown analog signal that is being converted. From input 10 the signal is applied simultaneously to an amplifier 12 and a similar amplifier 14, the output of amplifier 14 being applied to a subtractor 16. From a second input terminal 18 there is applied a forcing interrogate pulse (FIP) which is also applied as an input to amplifier 12. The output of amplifier 12 is applied to a plurality of primary comparators 20 and which in this adaptation consists of 32 units. The comparators are identified as N, N−1, N−2, up to N−31 but for the sake of simplicity only the first two or three of these are shown on the drawing. A second input is supplied to subtractor 16 by the output of primary comparator 20 and, after operating on the signals applied to the subtractor, its output is applied to a plurality of subprimary comparator 22 and here, like the primary comparator, there are 32 of these items and they are shown as N, N−1, N−2 down to N−31, with only the first three being shown for simplicity. From the primary comparators output signals are applied to a primary decoder 24 which has two outputs. One of these outputs is applied to an adder 26 while the second output is applied to a subprimary decoder 28. Another input to adder 26 is supplied by an output produced by subprimary decoder 28 and after the addition has been performed by adder 26 there is produced a digital output on output terminal 30.

In FIG. 2 there is shown a series of primary comparator reference levels, which would be of course 32 in number, and are labeled RN, RN−1, RN−2, and so forth. The unknown analog signal shown as $e_x$ on the time chart is an upwardly curving line which in FIG. 2 is shown as passing through the threshold region RN−6 to RN−5 when FIP is applied. $T_C$ is a threshold RN−5 crossing forced by the FIP, and $A_D$ is the amplitude difference between $e_x$ and RN−5 at the instant of the threshold crossing. $T_I$ is the instant of interrogation on the time chart.

In FIG. 3 there is shown the plurality of subprimary comparator references, this time also 32 in number and shown as $R_S$, or $R_S$−1, or $R_S$−2 and so forth. This figure which is a chart of the FIP plotted against time shows the FIP as an upwardly moving straight line crossing the comparator reference levels. At the time the FIP has tripped off the unknown analog signal $e_x$, FIP has traversed through $R_S$−9 but is short of $R_S$−8 at the instant that $T_C$ occurred. $A_D$ is the value of amplitude difference between $e_x$ and $R_S$−5; however, $R_S$−9 will be the value read out of the decoders.

Turning now to the operation of the device it should be recalled that the significant concept associated with the invention is a technique used to determine the level of the analog signal in the primary comparators. This concept makes use of a forced threshold transition which can be random if so desired. A forced threshold transition is effected by adding a fast-rising pulse to the unknown analog signal $e_x$. As shown in FIG. 2 this pulse is at least 32 quanta in amplitude. This transition indicates the threshold below which the unknown analog signal lies at that particular instant of time. In FIG. 3 the subprimary stage determines how far below this threshold the unknown signal lies. Therefore, the unknown analog signal $e_x$ is applied via input terminal 10 to isolating amplifiers 12 and 14. Amplifier 12 also has an input terminal 18 for accepting the forcing interrogate pulse (FIP). Each of the comparators 20 and 22 have a reference voltage associated with them which differs in magnitude by one thirty-second of the full scale value of the input voltage. Thus, if the full scale value is 8 volts the difference between reference levels is 0.25 volts. Whenever a conversion is required a forcing interrogate pulse is applied to amplifier 12 which adds directly to the unknown analog signal $e_x$. This pulse has an amplitude of 0.25 volts or slightly greater; consequently it will always force a threshold crossing of the reference immediately above $e_x$ in amplitude. The output of amplifier 12 after passing through primary comparator 20 is applied to a subtractor 16 along with the output of amplifier 14 before being applied to a set of 32 subprimary comparators 22. Effectively, $e_x$ plus FIP, and $e_x$ are subtracted in the subprimary circuitry. This leaves only the FIP. This pulse crosses the reference threshold $R_S$, $R_S$−1 and so forth in the subprimary circuitry as shown in FIG. 3. The number of thresholds of one quanta it has crossed at the instant the FIP crosses the threshold, the primary comparators 20, is a measure of the difference between the value of $e_x$ and the threshold crossed in the primary circuits. The indication that a threshold has been crossed, in the primary circuitry, is used to designate that threshold and also it is used to read out the highest threshold value crossed in the subprimary circuitry by the FIP (zero time delay is assumed for the sake of clarity). The two threshold values are decoded by decoders 24 and 28 and applied to an adder 26 to arrive at an actual digital value of the analog $e_x$ as produced on output terminal 30. The subprimary comparators 22 can be mechanized in at least two ways. One involves floating the comparators upon the signal from amplifier 14. Thus when amplifier 12 plus FIP is applied across the comparators 20 the comparators only see the FIP as a signal that can cause thresholds to be exceeded. Another technique is to subtract a signal from amplifier 12 plus FIP and a signal from amplifier 14 in appropriate circuitry. The difference between these two is again FIP which is then measured in the subprimary comparators.

Figure 1:
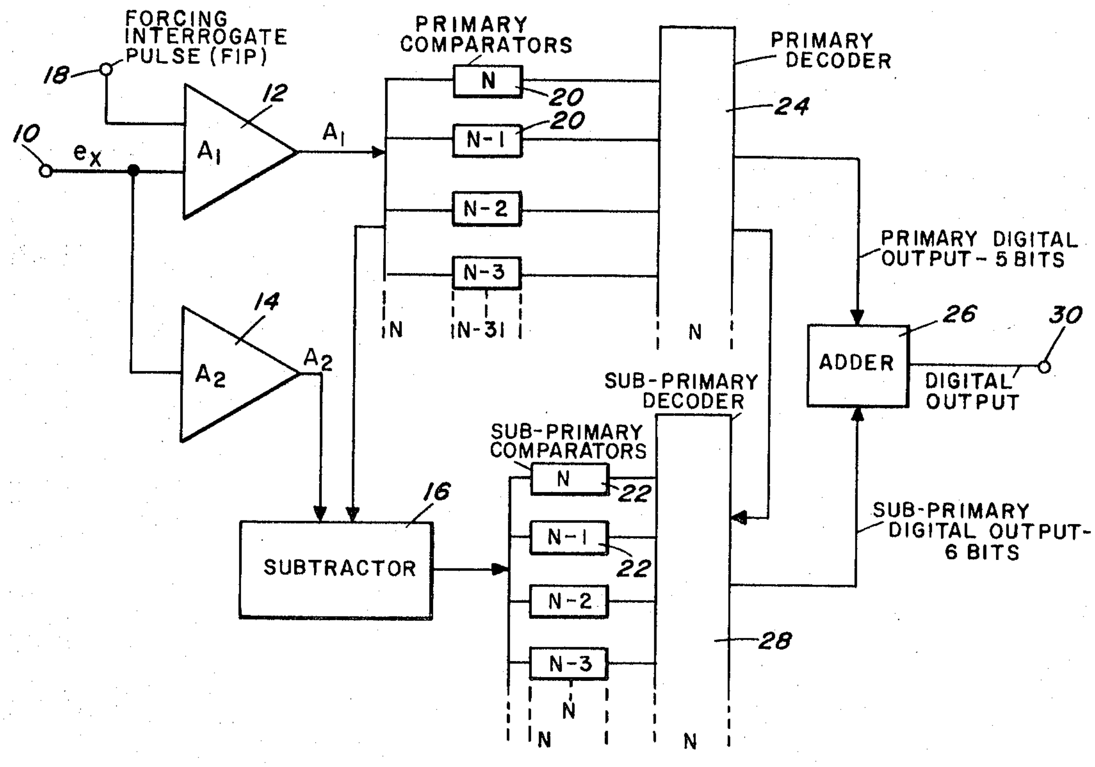
FIG. 1 shows a block diagram of the analog to digital converter.
Figure 2:
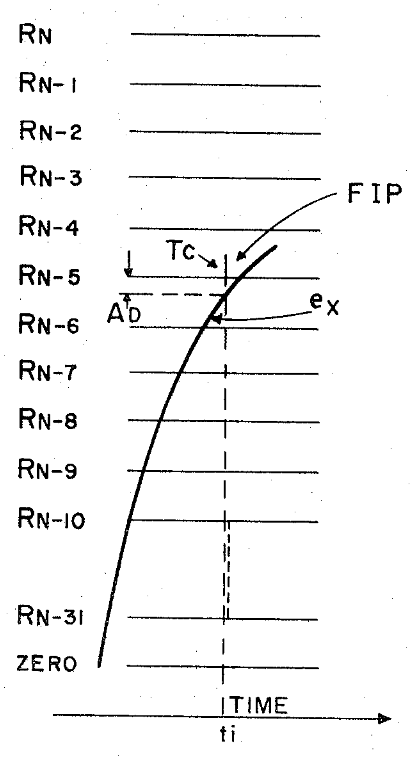
FIG. 2 shows a graphic presentation of the primary comparator reference levels when a forcing interrogate pulse has been applied thereto.
Figure 3:
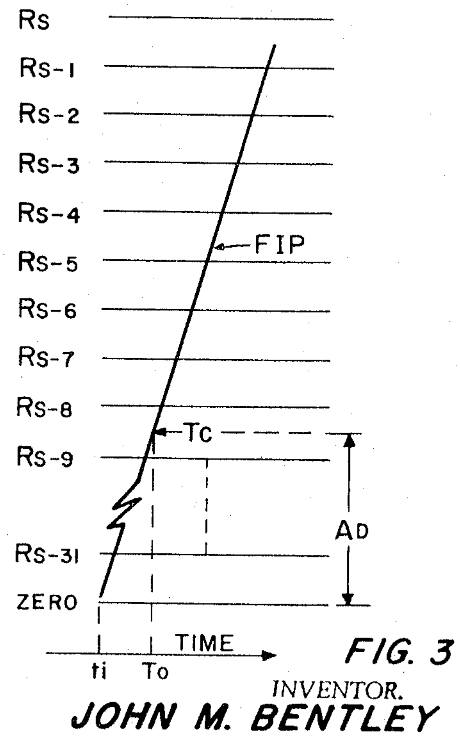
FIG. 3 shows a graphic presentation of the subprimary comparator reference levels when a forcing interrogate pulse is applied thereto.

A delay element equivalent to the delay of the primary comparators maybe added in series with amplifier 12 plus FIP and amplifier 14 prior to applying these to the subprimary comparators 22. This will ensure a more accurate conversion of the subprimary signal by compensating for the delay of the FIP through the primary comparators. This delay may be in the order of 10 nanoseconds or less with the state-of-the-art devices. To perform a conversion on a 5 megahertz signal during the time the signal could change by one quanta at 0.1 percent accuracy would require a decision to be completed in the aperture time of approximately 0.03 nanoseconds. Thus real time conversion requires extremely short response periods. If a conversion is required at a specific point on a signal then a delay of some kind is usually employed to provide the time required for the conversion. This delay usually takes the form of a delay line, a series of amplifiers or a sample and hold device. With a sample and hold circuit at the input of the subject analog to digital converter, a conversion system results which is extremely fast and accurate with respect to time and is limited only by the speed of the sample and hold. However it is not always necessary that a real time conversion be completed in one aperture time (time to change one quanta). The FIP can then be allowed to rise at some slower rate. When the primary comparator is forced through a threshold the digital value developed is accurate for the point of time.

If the FIP is configured to rise linearly with time and if, as an example, it required 1 nanosecond to traverse one quanta in the subprimary comparators, then the number of thresholds crossed can be interpreted as time in nanoseconds. This number would then be added to the time of initiation of the FIP to determine exactly where the conversion was completed. Averaging can be performed to determine signal values between samplings.

From the above description of the structure and operation of the device it is clear that the invention provides an analog to digital converter which represents considerable improvement over the disadvantages and shortcomings of prior art converters. An unknown signal is converted to a wide band analog signal in real time at high bit rates and accuracy without the use of first a digital to analog converter followed by successive comparisons or subtractions of reference voltages. The system disclosed herein utilizes a one-decision scheme, thereby eliminating the prohibitive amount of hardware necessary for systems requiring a number of decisions, and it is not of a full parallel type.

Obviously many modifications and variations of the present invention are possible in light of the above teachings. It is therefore to be understood, that within the scope of the appended claims, the invention may be practiced otherwise than as specifically described.

What is claimed is:

1. An analog to digital converter comprising:

input means for receiving a wide band unknown analog signal to be converted into digital representation;

first and second amplifiers connected to the input means;

means for applying a forcing interrogate pulse to the first amplifier;

a plurality of primary comparators for receiving the output of the first amplifier;

a subtractor for receiving signals from the primary comparators and the second amplifier;

a plurality of subprimary comparators connected to the subtractor;

a primary decoder connected to the primary comparators;

a subprimary decoder connected to the subprimary comparators;

an adder for combining the outputs from the two decoders; and a digital output from the adder.

2. The device of claim 1 wherein the forcing interrogate pulse is a fast-rising pulse.

3. The device of claim 2 wherein each of the comparators has a reference voltage associated with it which differs in magnitude by one thirty-second of the full scale value of the input voltage.

4. The device of claim 3 wherein the primary comparators determine the particular threshold below which the unknown analog signal lies at a particular instant of time.

5. The device of claim 4 wherein the subprimary comparators determine how far below that particular threshold the unknown analog signal lies.

6. The device of claim 5 wherein the subtractor subtracts the unknown analog signal from the output of the primary comparators.

* * * * *